US010732463B1

(12) United States Patent
Calafiore et al.

(10) Patent No.: US 10,732,463 B1
(45) Date of Patent: Aug. 4, 2020

(54) FABRICATION OF NANO-SCALE ALIGNMENT PATTERNS FOR LIQUID CRYSTALS TO CREATE SWITCHABLE OPTICAL COMPONENTS

(71) Applicant: Facebook Technologies, LLC, Menlo Park, CA (US)

(72) Inventors: Giuseppe Calafiore, Redmond, WA (US); Wai Sze Tiffany Lam, Redmond, WA (US); Lu Lu, Seattle, WA (US); Babak Amirsolaimani, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 3 days.

(21) Appl. No.: 15/976,627

(22) Filed: May 10, 2018

Related U.S. Application Data

(60) Provisional application No. 62/509,032, filed on May 19, 2017.

(51) Int. Cl.
*G02F 1/1337* (2006.01)
*G02F 1/1347* (2006.01)
*G02F 1/1341* (2006.01)
*G03F 7/00* (2006.01)
*G02F 1/1335* (2006.01)

(52) U.S. Cl.
CPC ...... *G02F 1/133788* (2013.01); *G02F 1/1341* (2013.01); *G02F 1/1347* (2013.01); *G02F 1/133528* (2013.01); *G02F 1/133753* (2013.01); *G03F 7/0002* (2013.01); *G03F 7/0007* (2013.01); *G02F 1/133711* (2013.01); *G02F 2001/133757* (2013.01)

(58) Field of Classification Search
CPC ............... G02F 1/1347; G02F 1/13378; G02F 1/133788; G02F 1/133528; G02F 1/133753; G02F 1/1341; G02F 1/133711; G02F 2001/133757; G02F 2001/133776; G03F 7/0002; G03F 7/0007
See application file for complete search history.

(56) References Cited

U.S. PATENT DOCUMENTS

| 2015/0138460 A1* | 5/2015 | Sugiyama | G02F 1/133784 349/15 |
| 2015/0309370 A1* | 10/2015 | Park | B29C 59/04 428/156 |

OTHER PUBLICATIONS

Lee, B-W. et al., "Alignment of Liquid Crystals with Patterned Isotropic Surfaces," Science, Mar. 30, 2001, pp. 2576-2580, vol. 291, Issue 5513.

\* cited by examiner

*Primary Examiner* — Nathanael R Briggs
(74) *Attorney, Agent, or Firm* — Morgan, Lewis & Bockius LLP (57) ABSTRACT

A method for fabrication of a nano-scale mold to create a high precision alignment layer for liquid crystals is described. The method comprises forming a nano-scale mold with a negative of a liquid crystal alignment pattern and imprinting a resist material on the mold. The method further comprises performing a set operation on the resist material to cause the resist material to set, the resist material forming a liquid crystal alignment layer. The nano-scale mold is separated from the liquid crystal alignment layer. The method further comprises performing an infiltration operation to cause the liquid crystals to be deposited on the alignment layer, the alignment layer causing the liquid crystals to form the liquid crystal alignment pattern.

19 Claims, 6 Drawing Sheets

FABRICATION OF NANO-SCALE ALIGNMENT PATTERNS FOR LIQUID CRYSTALS TO CREATE SWITCHABLE OPTICAL COMPONENTS

CROSS-REFERENCE TO RELATED APPLICATIONS

This application claims the benefit of U.S. Provisional Application No. 62/509,032, filed on May 19, 2017, which is incorporated by reference in its entirety.

BACKGROUND

The present disclosure generally relates to methods of fabricating nano-scale level alignment patterns for liquid crystals to create switchable optical components.

In the fabrication of components that utilize switchable photonics, such as liquid crystal displays, the liquid crystals (LCs) in the component are initially aligned to a specific pattern. Upon application of an electric current, the LCs may deviate from their original alignment in accordance with the electric field produced by the electric current. The different alignments of the LCs affect the polarization and phase of light traversing through the LCs. Thus, the initial alignment of the LCs is important in determining the subsequent performance of the switchable photonics component. However, current methods of initial alignment of LCs do not allow a high degree of customizability and throughput at a low fabrication cost. For example, the rubbing method is commonly used to prepare an initial alignment for LCs by rubbing a soft polymer on a surface to generate microscopic grooves upon which LCs can align. Another commonly used method is pre-patterning. However, this method is complex, slow, expensive, and can generate unwanted diffraction effects in the final product.

SUMMARY

Embodiments herein describe a method for fabricating a high precision alignment layer for liquid crystals. The method comprises forming a nano-scale mold with a negative of a liquid crystal alignment pattern; imprinting a resist material on the mold; and performing a set operation on the resist material to cause the resist material to set, the resist material forming a liquid crystal alignment layer. The method further includes separating the nano-scale mold from the liquid crystal alignment layer; and performing an infiltration operation to cause the liquid crystals to be deposited on the alignment layer, the alignment layer causing the liquid crystals to form the liquid crystal alignment pattern.

Embodiments herein also describe a device comprising a layer of liquid crystals. The layer of liquid crystals are aligned according to a liquid crystal alignment pattern, and the liquid crystal alignment pattern is formed by infiltrating liquid crystals into a liquid crystal alignment layer formed via an imprint from a nano-scale mold.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Overview

Embodiments include a method of fabricating a liquid crystal (LC) alignment layer with nano-scale precision, high throughput, and low cost. A nano-scale mold is created using various lithography or other fabrication processes, such as photo-lithography, embossing, etc. The mold includes a negative of a LC alignment pattern. The mold is used to imprint on a resist material, e.g., a photo-resist polymer, such that the resist material forms a pattern that is the inverse (i.e., negative) of the pattern created on the mold. The resist material is set or cured (e.g., by ultraviolet light), and LCs are deposited on the resist material, which acts as an LC alignment layer. Various alignment patterns and features (sub-10 nm) may be formed using the nano-scale mold technique described here, which allow more detail compared to previous methods (e.g., rubbing). Furthermore, as the mold is created once but used multiple times, throughput can be high and costs can be low, even if the creation of the mold is relatively expensive.

Such a method allows the creation of an LC alignment pattern with high customizability. For example, an intricate LC alignment pattern may be developed in order to produce a liquid crystal display that supports 3D viewing via alternate polarization of different pixels on the screen due to the customized alignment pattern. Unlike existing polarized 3D displays, which may use an additional filter on top of the LCD panel, by modifying the LCD panel directly, costs is reduced, screen brightness may be increased, and additional detail may be preserved in the displayed image. Additionally, LC alignment patterns may be used to create optical elements such as, e.g., LC based lenses and/or diffraction gratings. Such optical elements may be used in, e.g., head-mounted displays (HMDs) for virtual/augmented/mixed reality systems.

The high degree of customization of the LC alignment layer may have other beneficial applications. This may include simplifying components or improving technologies in polarized light microscopy, photoelasticity analysis, polarization of radio/electromagnetic EM radiation signals, and other switchable optical functions, etc.

Figure 1:
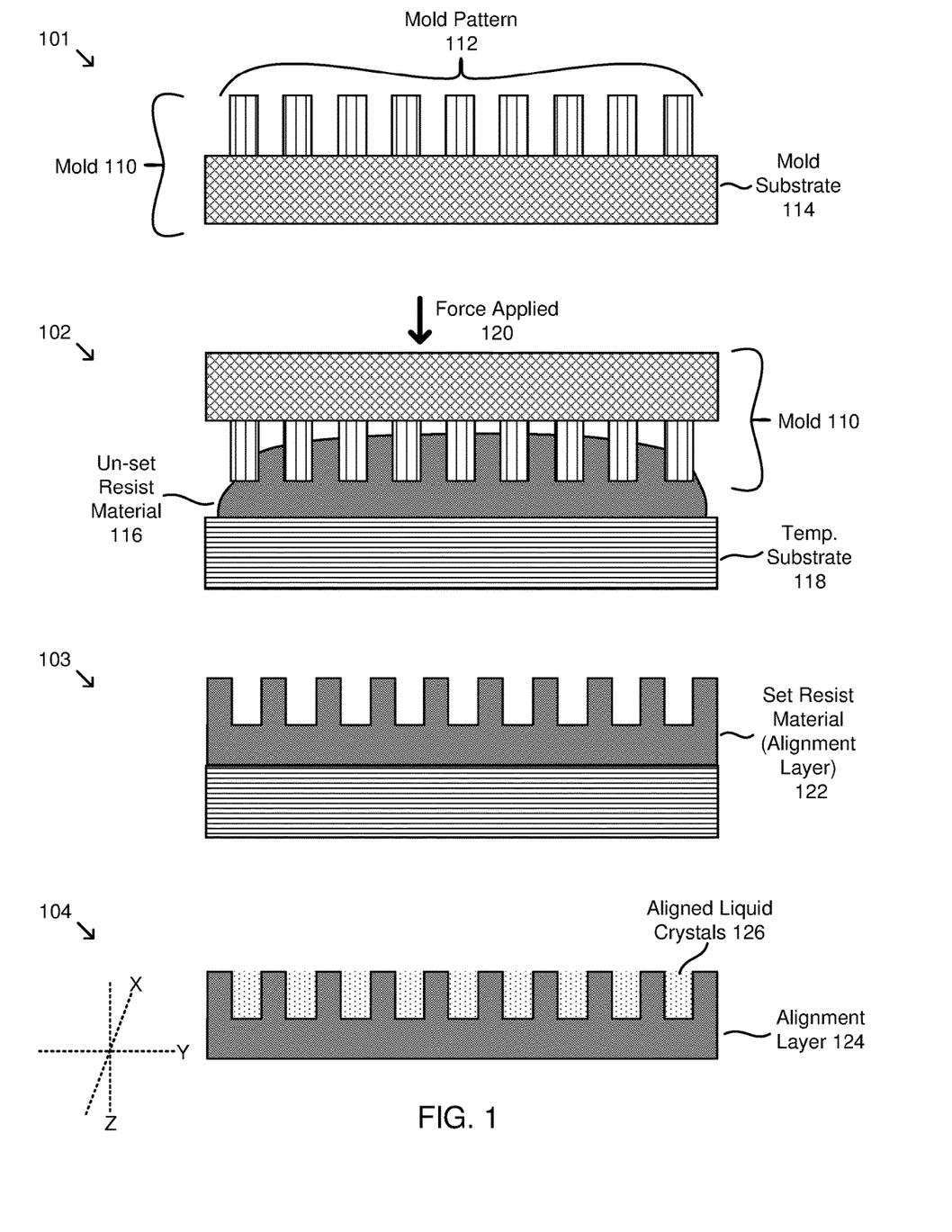
FIG. 1 is an example diagram of a process for creating a precision alignment layer, in accordance with an embodiment.

Exemplary Process for Using a Nano-Scale Mode to Create a Precision Alignment Layer FIG. 1 is an example diagram of a process for creating a precision alignment layer, in accordance with an embodiment. Although the description here is made in regards to certain materials and steps, it is not meant to imply that the process described here is the only order of operations available to achieve the resulting alignment layer or that the materials that may be used are limited to those described here. Furthermore, while FIG. 1 illustrates the components in the process as two-dimensional cross-sections, the components are actually three-dimensional. In addition, the patterns shown in FIG. 1 are meant only to be for explanatory purposes. In practice, the different patterns, such as the mold pattern 112 and resulting pattern for the alignment layer may be significantly varying across all three dimensions.

At stage 101, a mold 110 is formed. The mold is comprised of a mold pattern 112 and a mold substrate 114. The mold substrate 114 and mold pattern 112 may be created from any material that may form a solid and which may be used to form nanometer scale (e.g., below 50 nm) features (i.e., the material of the mold is capable of forming distinct features at the nanometer scale). The material may be a polymer, metallic, semiconductor, crystalline, or other material, or combination of any of these materials. Examples of specific materials include silicon, nickel, polydimethylsiloxane, poly-methyl methacrylate (PMMA), glass, and so on.

The choice of mold material may be dictated by the type of resist material 116 used. Depending on the method use to set or cure the resist material, the choice of mold material may be selected which is resistant or unaffected by the method of setting the resist material. For example, a UV-resistant mold material (e.g., silicon) may be used when the resist material is cured using UV radiation. The mold material may also be chosen based on the type of method used to fabricate the mold. For example, if the mold is to be formed in part using an electron beam, then a portion of the mold 110 may be formed from PMMA, more commonly known as acrylic. PMMA is an electron beam resist, and may be coated on a silicon substrate, after which it is exposed to the electron beam pattern, and the exposed areas removed using a solvent. The mold material may also be chosen based on the type of manufacturing process. For example, nickel may be used for its high durability in the case where a certain amount of flexibility is desired in the mold due to a curvature desired in the alignment layer that is to be generated.

Although a planar mold 110 is illustrated in FIG. 1, in one embodiment the mold 110 may be cylindrical, spherical or curved in shape, with the mold pattern 112 formed on the exterior of the cylindrical, spherical or curved mold. As will be described below, the mold is placed on the resist material 116 in order for the resist material to take the inverse pattern present on the mold. In the case of a cylindrical, spherical or curved mold, the mold 110 would be rolled across the resist material to achieve the same effect. This allows for a repeating pattern to occur due to the cylindrical, spherical or curved shape.

The mold pattern 112 is formed to be the negative (i.e. the inverse) of the alignment layer that is to be created. Thus, a protrusion in the mold pattern 112 results in a depression in the alignment layer. The liquid crystals, after deposition onto the alignment layer, naturally align in an orientation parallel to the longitudinal direction of the depressions in the alignment layer. In other words, the LCs naturally rest within the depressions in an orientation that reduces the potential energy of the LCs. For example, if the depression forms a groove along an X direction (e.g., as shown, with the X direction being normal to the plane of the figure), the LCs, when deposited on the grove, naturally orient along the groove (lengthwise) in the same X direction.

Hence, the mold pattern 112 is designed to be a negative of a desirable alignment pattern. As described above, the mold material may be one of many different types of materials. Depending upon the material used, different methods may be used to form the mold pattern 112. These may include photo-lithography, embossing, nanoimprint lithography (NIL), etching, scanning probe lithography, two-photon, electron beam, focus ion beam, lost wax casting, etc. For example, photolithography may be used to create the mold pattern 112 on top of the mold substrate 114. Using photolithography, a fabrication process (e.g., at a semiconductor foundry) may form layer after layer of photoresist and photomask made from light sensitive and insensitive materials, exposing each layer of photoresist to light as well as etching each photoresist layer, until a detailed three-dimensional pattern is generated as the mold pattern 112. Depending on the material and fabrication process used for the mold pattern 112, the feature size (e.g., the minimum size for each feature in the mold pattern 112) may be sub-10 nanometers. Thus, a highly detailed mold pattern 112 may be generated. Although this initial fabrication of the mold pattern 112 may be expensive, subsequent usage of the mold 110 in the formation of the alignment layer may be much cheaper in comparison. The exact type of mold pattern 112 that is created depends upon the type of alignment layer that is desired. For example, the mold pattern 112 may be designed such that the resulting alignment layer modifies the polarization of light passing through it (after LCs have been deposited) to a desired configuration.

At stage 102, the mold 110 is pressed against an un-set resist material 116 that has been deposited on a temporary substrate 118. The temporary substrate 110 supports the resist material 116 and may be made of the same material as the mold substrate 114.

The un-set resist material 116 is resist material that has not been set or cured, i.e., is still malleable. Although the resist material 116 is labeled as resist material, it is not necessarily photoresist material, and can be set by temperature (beyond a curing temperature), chemical, or by some other means. When set, the resist material 116 becomes rigid and not deformable. However, before setting, the resist material 116 is deformable when pressure is applied to it. The mold 110 is pressed against the resist material 116 with a force applied 120, causing the resist material to fill the voids and cavities of the mold 110. The amount of force applied 120 is sufficient to allow the un-set resist material 116 to be forced into the voids in the mold 110 (e.g., 120 N/m2). The force may be applied for a certain period of time (e.g., 10 seconds). Furthermore, a certain temperature (e.g., 170° C.) may be maintained throughout the duration, and/or a certain internal temperature for the resist material 116 may be maintained throughout the pressing stage (e.g., via the use of heating elements). This internal temperature may be above the glass temperature for the resist material 116 (i.e., a temperature above which the resist material 116 is able to deform in response to applied forces).

The un-set resist material 116, at least when set, is transparent or nearly transparent to a range of EM frequencies, such as the range of visible light frequencies. This is as it forms the alignment layer 124, and thus should be capable of allowing some range of EM radiation to pass through it to the liquid crystals. The un-set resist material 116 may be some form of thermoplastic, polymer, optically transparent photoresist, and so on.

The mold 110 may be pressed into the un-set resist material 116 using a hydraulic press, flip chip bonder, or other device capable of exerting a physical force against two objects.

After a prescribed press time for the pressing operation, which may be sufficient to allow the un-set resist material 116 to fill the voids within the mold 110, the un-set resist material 116 is set or cured. This may occur using exposure to light, e.g., UV light, if the resist material 116 is photoresist, or by heat energy at a specific curing temperature, if the un-set resist material 116 is temperature cured, or by other means, such as application of a curing chemical. As the process for setting the resist material may cause shrinkage or other changes in the shape of the un-set resist material 116, a suitable resist material that does not change shape significantly after curing or setting may be used, or the mold 110 may be developed to a size not directly inverse to the desired alignment layer size in order to compensate.

In one embodiment, both the mold 110 and temporary substrate 118 may include alignment features, such as optical or electronic markers, mechanical alignment apparatus, or other features such that the mold 110 is pressed onto the temporary substrate 118 in the same position for each application of the mold 110.

At stage 103, the resist material 122 is set. After the resist material 112 is set, the mold 110 is removed for use with new resist material 116 to create a new alignment layer. In one embodiment, an anti-adhesion substance (e.g., Teflon) is applied to the mold pattern 112 to ensure that the resist material 116 does not adhere to the mold pattern 112 during formation of the alignment layer from the resist material 116. This material may be etched away or washed away at the stage 103. Any excess resist material 116 may also be etched away or physically removed (e.g., with an ablative or physical cutting tool, such as laser).

At stage 104, liquid crystals may be deposited in the alignment layer 124, which was formed by the resist material 122 after it was set. Due to the pattern in the alignment layer as specified in mold 110, the LCs align in accordance with the pattern of the alignment layer to form the aligned liquid crystals 126.

In one embodiment, in addition to the process described above, the mold 110 is first replicated into a daughter mold (i.e., another mold). The daughter mold is used to create the alignment layer 124, while the mold 110, the master mold, is stored to create daughter molds only. This can increase the longevity of the original (master) mold 110.

Using such a method, as described above, a highly detailed alignment pattern can be fabricated at a low cost and high throughput. These alignment pattern can be used to align liquid crystal into spatially varying patterns on flat, cylindrical, spherical, or curved surfaces. This spatially varying liquid crystal may have many applications, such as for use in an enhanced 3D display, to create spatially varying phase plate, geometric-phase lenses and geometric-phase beam steering component, and for other switchable optical functionalities. Additional details regarding this process are described below with regard to FIGS. 2-6.

Exemplary Liquid Crystal Infiltration Process in an Alignment Layer Stack

Figure 2:
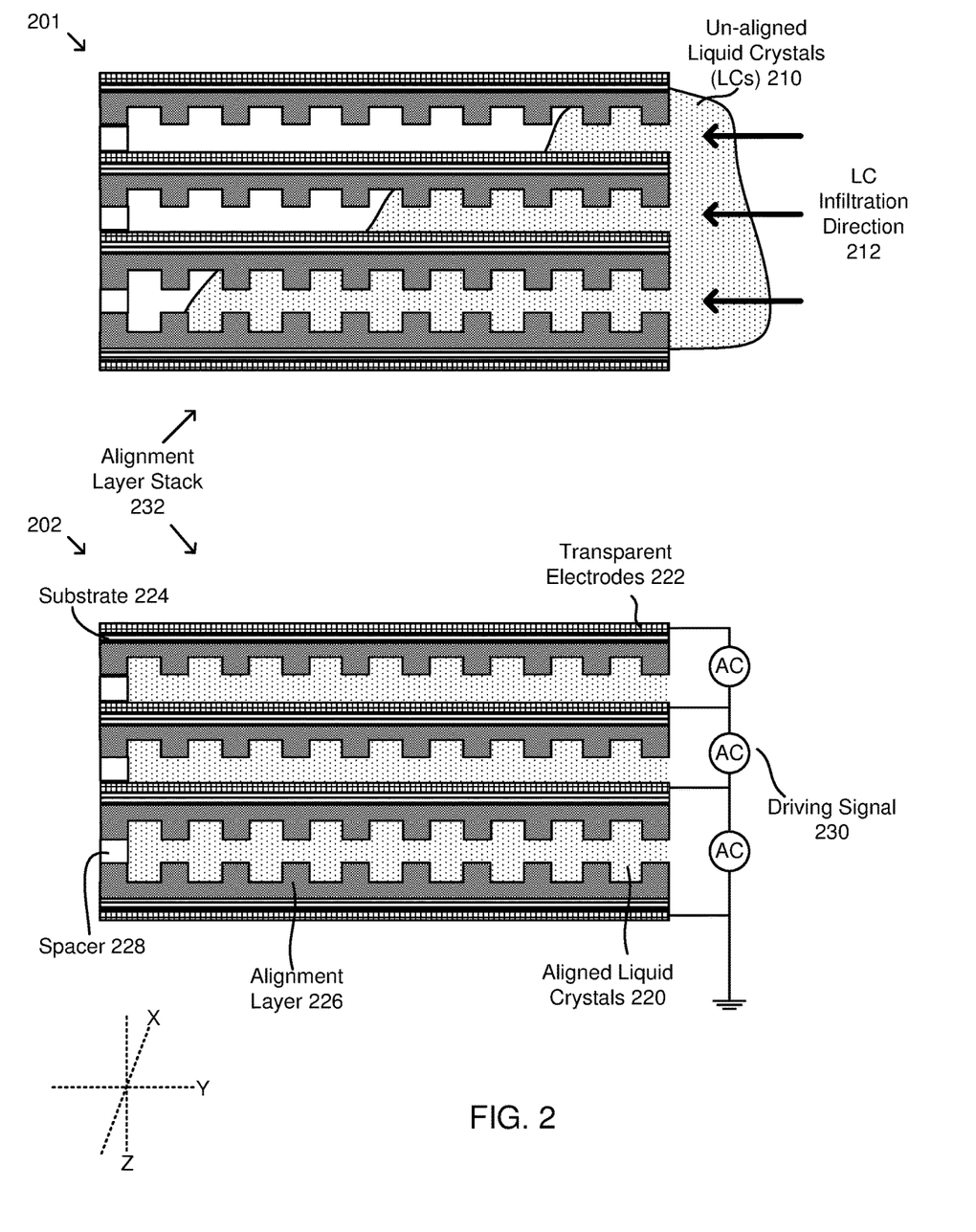
FIG. 2 illustrates a continuation of the process from FIG. 1 of the infiltration of liquid crystals into a completed stack of alignment, electrode, and substrate layers, according to an embodiment.

FIG. 2 illustrates a continuation of the process from FIG. 1 of the infiltration of liquid crystals into a completed stack of alignment, electrode, and substrate layers, according to an embodiment.

After forming the precision alignment layer(s), e.g., according to the process described with regard to FIG. 1, the fabrication process may layer multiple alignment layers into a single stack 232, as shown in FIG. 2 at stages 201 and 202. As shown in FIG. 2, the exemplary stack has a double alignment layer, with two alignment layers facing each other, along with two single alignment layers layered on top of the double alignment layer. Each alignment layer is also placed directly adjacent to a substrate 224, and each substrate is placed directly against a layer of transparent electrodes 222 (although in some embodiments the order of the substrate and electrode layers are reversed). The alignment layers are separated by spacers 228, which may be made of the same material as the substrate 224. The various layers may be adhered to each other using an adhesive that is transparent to the same range of EM radiation to which the alignment layers 226 are transparent. Each layer may include alignment features (e.g., alignment features that are optical, physical, electrical, etc.) that assist the fabrication process in aligning the layers together.

Furthermore, the layers of transparent electrodes 222 are electrically coupled to driving signal(s) 230. Each layer of transparent electrodes 222 may be patterned or un-patterned. An application of an electric current in the driving signal against a pair of transparent electrodes 222 causes the LCs between those two electrodes to align with the resulting electric field that is generated. This in turn may cause the LCs to cease the modification of the polarization of the EM radiation (e.g., light) that is passing through them (e.g., the LCs no longer rotate the polarization of the incoming light by 90 degrees).

At stage 201, the LCs flow into the voids between the alignment layers as shown via capillary action, as shown by the LC infiltration direction 212. The actual gap between the alignment layers may be of a size such that capillary action is possible (e.g., <1 µm). Once a sufficient amount of LCs have infiltrated into the alignment layer stack 232 (e.g., such that no air gaps exist within the alignment layer stack 232), the infiltration point may be sealed (e.g., using a spacer) and the electrical connections for the driving signal 230 may be coupled to the alignment layer stack 232 if they had not been previously.

The LCs within the alignment layer stack naturally align in accordance to the alignment patterns on the alignment layers 226. In the case of a double alignment layer, the LCs may align at one end according to the pattern of one alignment layer, and at the other end, "twist" to align against the pattern of the opposing alignment layer. In the case of the single alignment layer (i.e., where an alignment layer faces a substrate or layer of transparent electrodes only), the LCs may align in accordance with the alignment pattern on the alignment layer (e.g., each LC may align with the nearest pattern). As noted above, LCs align according to the depressions in each alignment pattern on each alignment layer 226.

By varying the number of layers in the alignment layer stack 232, the applied voltage in the driving signal 230 to each layer, the patterns in each layer (via the molding process), the path, orientation, speed, and other characteristics of EM radiation passing through the alignment layer stack 232 can be varied. This allows for the application of various switchable optical functionalities, such as lensing, diffraction, wavefront engineering, and other means of directing light can be achieved, in addition to the applications described above. The fabrication of the alignment layer stack 232 via the molding process described above with reference to FIG. 1 allows each stack 232 to be created quickly and with low expense, allowing the viable mass production of these switchable optical components.

Exemplary Process for Double Patterning Formation of an Alignment Layer

Figure 3:
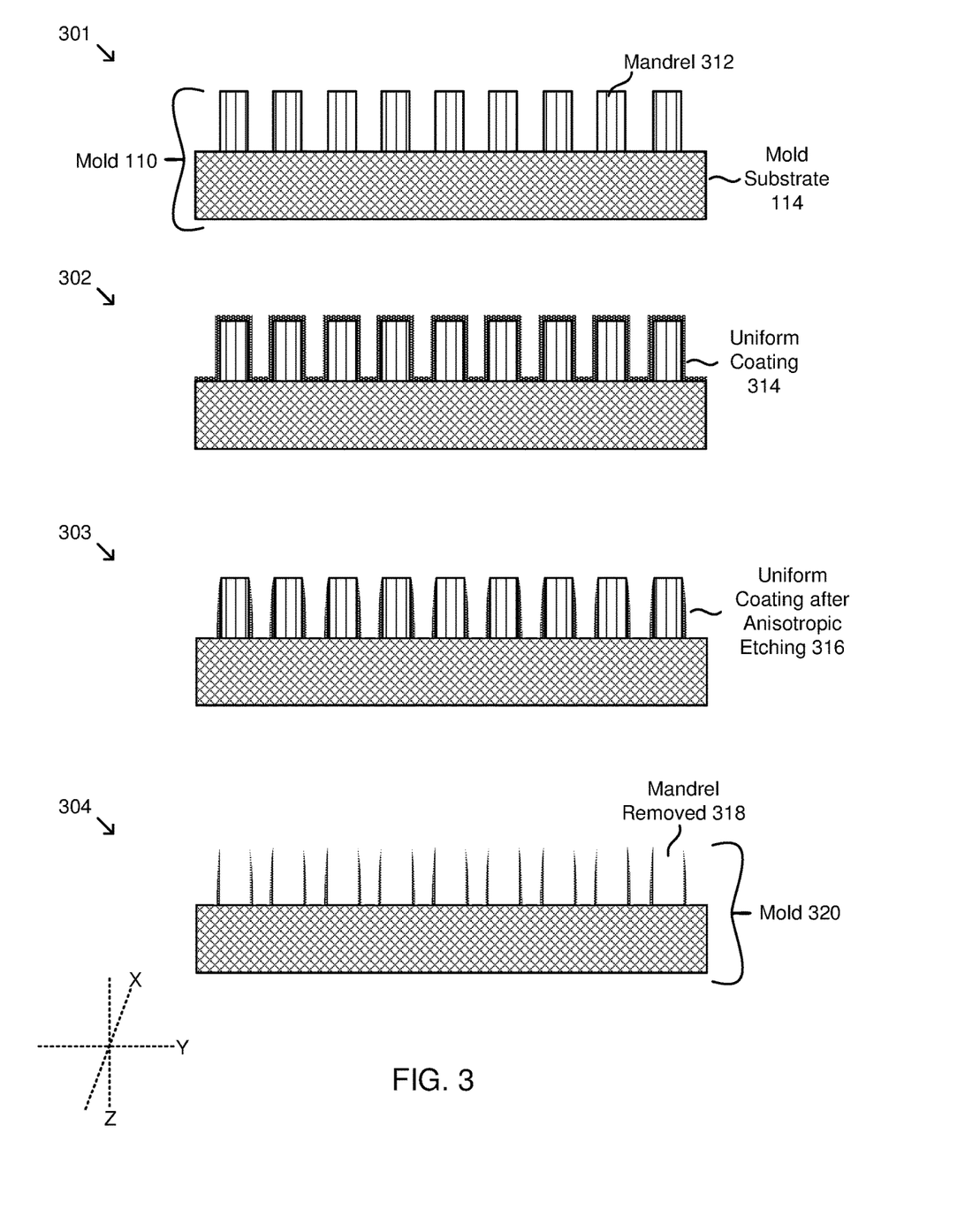
FIG. 3 illustrates an alternate process of forming an alignment layer using double patterning, according to an embodiment.

FIG. 3 illustrates an alternate process of forming an alignment layer using double patterning, according to an embodiment. Although the description here is made in regards to certain materials and steps, it is not meant to imply that the process described here is the only order of operations or that the materials that may be used are limited to those described here. Furthermore, while FIG. 3 illustrates the components in the process as two-dimensional cross-sections, the components are three-dimensional in practice. In addition, the patterns shown in FIG. 3 are meant only to be for explanatory purposes. In practice, the different patterns, such as the mold pattern in mold 320, may be significantly more varied.

At stage 301, the mold 110 is formed similarly to the process described above with reference to FIG. 1. However, the mold pattern 112 from FIG. 1 is instead used to form mandrels 312, rather than the inverse of the alignment pattern. As described below, these mandrels 312 are ultimately removed. At stage 302, a uniform coating 314 is deposited onto the mold 110 such that the surface of the mold substrate 114 and the exposed sections of the mandrels 312 include a coating of a uniform thickness (e.g., 5 nm thick). The uniform coating 314 may be made of a different material than the mold material, and so can be etched away without affecting the mold material. The uniform coating 314 may be applied using a spin coating, electro and/or chemical deposition, or using some other method that is able to apply a uniform coating onto a surface.

At stage 303, the uniform coating is anisotropically etched away to form the uniform coating after anisotropic etching 316. During the anisotropic etching process, the portion of the uniform coating 314 on the surface of the mold substrate 114 is etched away completely. The portion of the uniform coating 314 deposited on the mandrels 312 are etched according to the position of the uniform coating 314 on each mandrel 312. The portion of the uniform coating on the top surface of each mandrel is etched away completely. The portions on the sides of each mandrel are etched away such that more material is etched away from the portions of the sides of the mandrels nearer the top of the mandrel than the bottom (the top being further in distance from the mold substrate 114). The result is a gradient where the uniform coating is thicker at the bottom of each mandrel 312 and thinner at the top.

The anisotropic etching may be achieved by simply depositing the etching solution on the surface of the mold with uniform coating 314. Due to the orientation of the surfaces of the uniform coating 314, those surfaces that are horizontal may be etched away faster than those that are vertical, with the vertical surfaces nearer the top having contacted the etching solution earlier and thus are etched away sooner. Before the entire uniform coating 314 is etched away, the etching solution may be washed away, leaving the anisotropic etching illustrated in stage 303 of FIG. 3. Alternatively, the anisotropic etching may be achieved by combining etching solution with non-etching solution in a combination that allows for the illustrated structure of the uniform coating 314.

At stage 304, the mandrels 312 are removed 318. The mandrels 312 may be removed by physical removal, etching, or any other fabrication method. The resulting mold substrate 114 and uniform coating after anisotropic etching 316 forms the mold 320 created using this double patterning process.

Subsequently, the mold 320 may be used in according to the process describe with regards to FIG. 1 to create the alignment layer with an alignment pattern that is the inverse of the mold pattern of the mold 320.

The double patterning method used here allows for the creation of features with twice the resolution of the lithography limit (due, e.g., to diffraction). Thus, if the lithography supports a 10 nm feature size, this allows twice the resolution, or 5 nm. Hence, sub-wavelength (sub-10 nm) features can be created which do not interfere with EM radiation (e.g., visible light) that has a wavelength that is greater than the feature size. This eliminates any grating effect that may arise from an alignment pattern with a larger feature size. Furthermore, as in FIG. 1, the mold 320 generated here need only be fabricated once in order to subsequently imprint multiple alignment layers composed of the resist material. These alignment layers stacked together may be used to create various geometric-phase lenses, which may be used to alter the polarization, phase, and other characteristics of EM radiation passing through the LCs which are deposited within the alignment layer stack.

Exemplary Single and Double Alignment Layers

Figure 4:
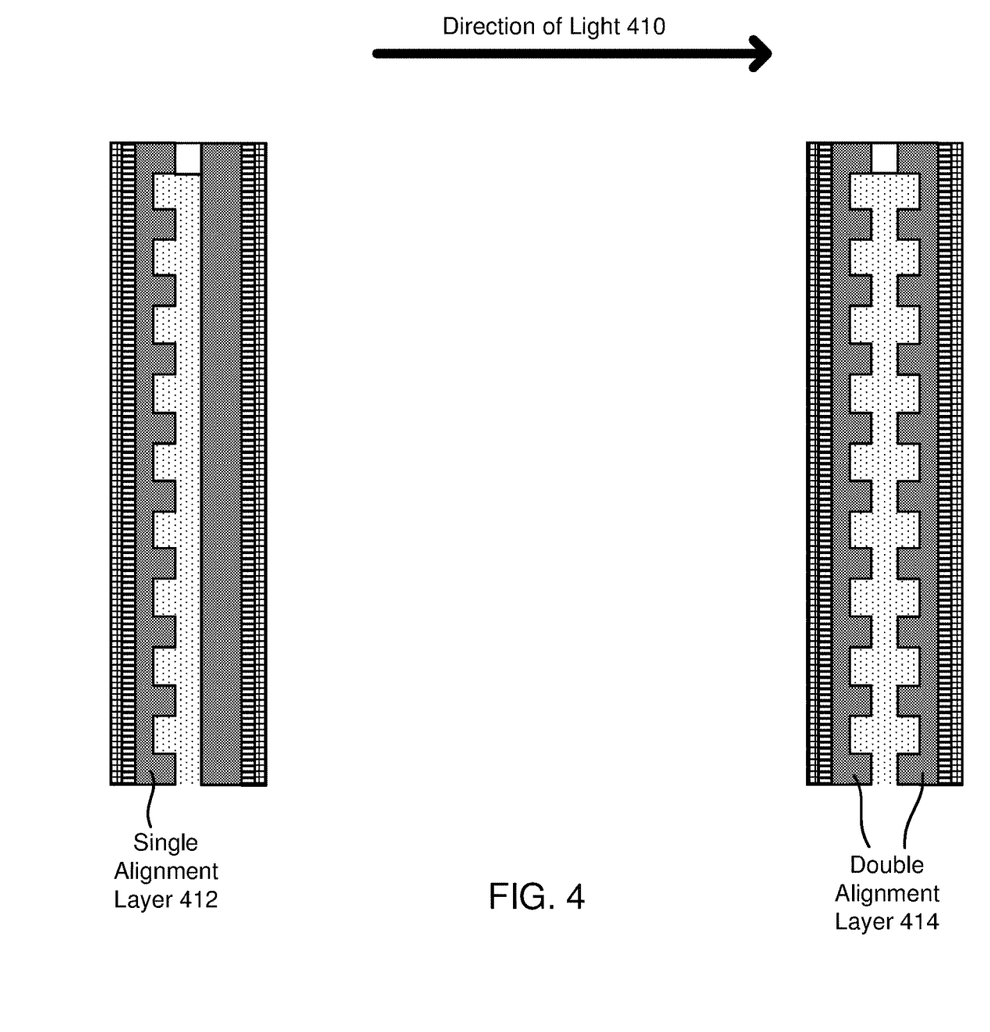
FIG. 4 illustrates two alternative arrangements of alignment layers in an alignment layer stack, according to an embodiment.

FIG. 4 illustrates two alternative arrangements of alignment layers in an alignment layer stack, according to an embodiment. As shown previously in FIG. 2, two alignment layers may face each other in the alignment layer stack, as shown with the double alignment layer 414, or alternatively an alignment layer may face a blank substrate as shown in the single alignment layer 412. The blank substrate may be comprised of the same resist material as the alignment layer.

In the case of the single alignment layer 412, the LCs align according to the pattern of the single alignment layer 412 only, as the opposing face has no pattern. When light (or other EM radiation) passes through the single alignment layer 412 (in the direction 410), the single alignment layer 412 acts as a polarization filter in accordance with the alignment pattern of the single alignment layer 412. By applying a voltage potential to the electrode layers surrounding the single alignment layer 412, a portion of the LCs are made to align with the resulting electric field, and the polarization function weakens. At a certain voltage, all or almost all of the LCs align with the electric field, and thus no polarization takes effect.

In the case of the double alignment layer 414, LCs align at both sides according to the alignment patterns on both alignment layers of the double alignment layer 414. This can allow light or other EM radiation passing through the double alignment layer 414 to be adjusted in polarization based on the spatial pattern of the aligned LCs and LCs' thickness between the double alignment layer 414. The application of a voltage along electrodes surrounding the double alignment layer 414 reduces the effective birefringence of the LCs, which retard the incoming light (or other EM radiation) and cause the phase and polarization of the light to be affected.

For the single alignment layer 412, the applied voltage forms an electric field permeating the LC layer that may force the orientation of the LC directors to align with the electric field lines. The alignment induced by the electric field may be strong enough to prevail on the nanopatterned alignment layer. A combination of these different single and double alignment layers, with intricate alignment patterns, can thus be used to achieve various effects as described above.

Exemplary Alignment Layers with Orthogonal Light Input and Output Directions

Figure 5:
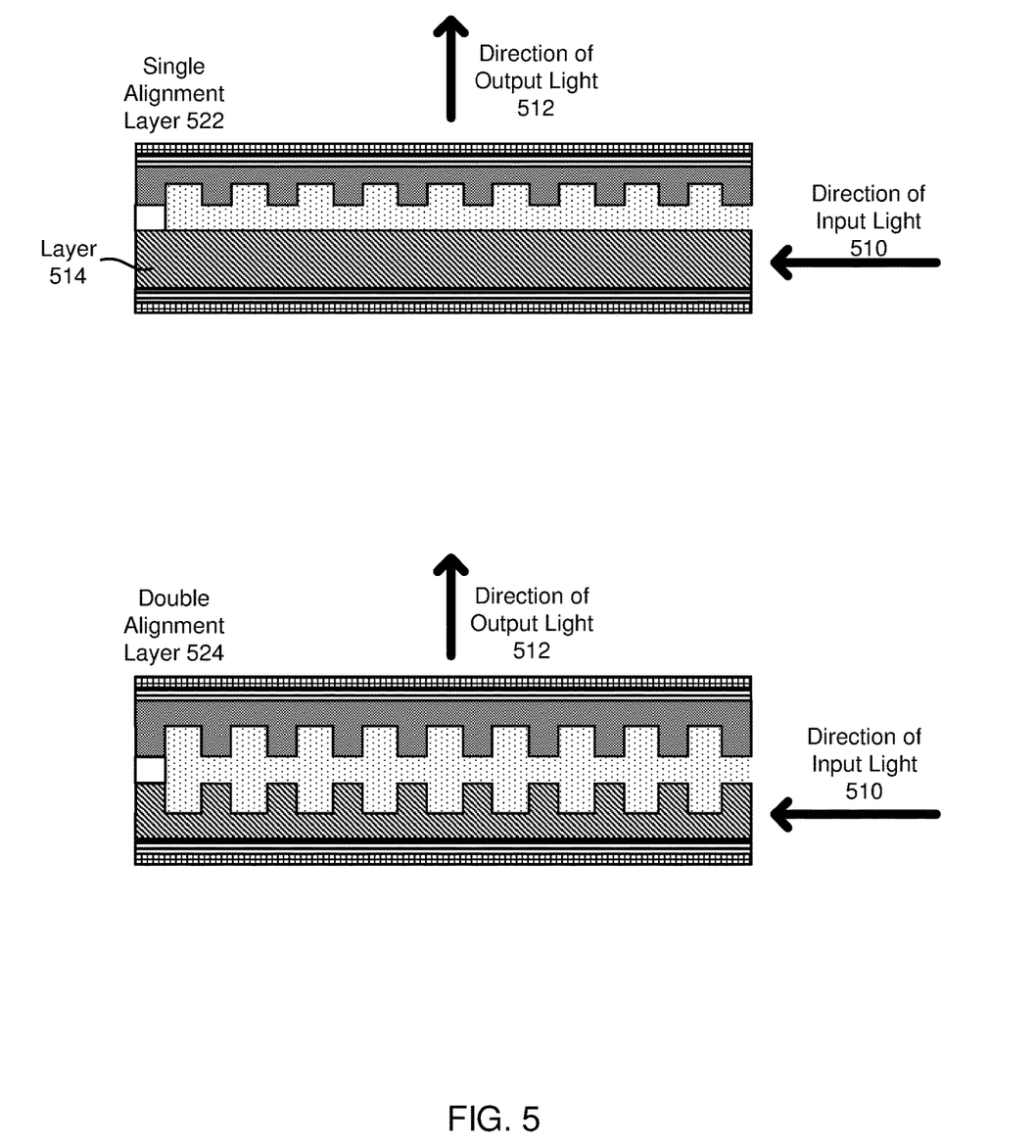
FIG. 5 illustrates an arrangement of alignment layers in an alignment layer stack with orthogonal input and output light directions, according to an embodiment.

FIG. 5 illustrates an arrangement of alignment layers in an alignment layer stack with input and output light directions being orthogonal to each other, according to an embodiment. As shown previously in FIG. 4, two alignment layers may face each other in the alignment layer stack, as shown with the double alignment layer 524, or alternatively an alignment layer may face a blank substrate as shown in the single alignment layer 522.

However, unlike in FIG. 4, the direction of input light 510 (or other EM radiation) in FIG. 5 is orthogonal to the direction of output light 512. Light enters the structure from layer 514, which is introduced beneath the alignment layer stack to waveguide the light in the plane (in-plane coupling). Layer 514 may be 0.1 to 2 mm thick and may be a single mode or multimode waveguide. Light entering layer 514 from the direction 510 reflects internally until it interacts with the LCs layer. The optical function performed by the LC enables light to escape the waveguide and alignment layer stack along the direction 512. Such a design as shown here allows light to be redirected in a different direction, as well as manipulated with regards to polarization and phase as described above using the precision alignment of LCs provided by the patterns on the alignment layers. As shown in FIG. 5, the in-plane coupling approach can be adopted with both a single-, double- or multi-alignment layer configuration.

Exemplary Flow for Fabricating a High Precision Alignment Layer

Figure 6:
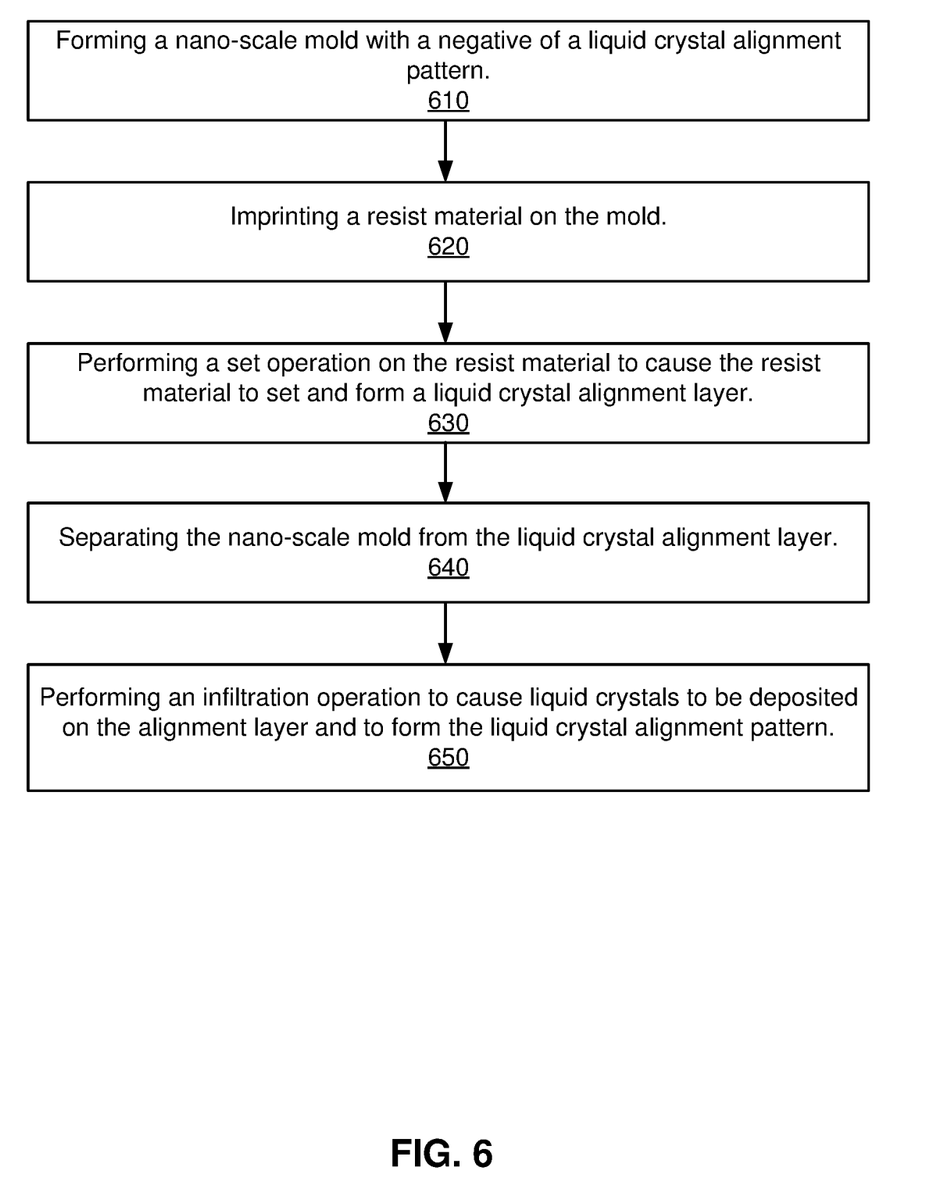
FIG. 6 illustrates and exemplary flow chart for the fabrication of a high precision alignment layer, according to an embodiment.

FIG. 6 illustrates and exemplary flow chart for the fabrication of a high precision alignment layer, according to an embodiment. Although a certain order is shown in FIG. 6, in other embodiments, the order may be different, and additional or fewer operations may be performed. In one embodiment, the process may be performed by a fabricator. The fabricator is a device or system of devices that is capable of fabricating the mold and alignment layers in any one of the fabrication processes described above. The fabricator may be similar to a system of fabrication devices used to form an integrated circuit, and may include such components as a clean room, etching component, photolithography device, electron beam device, and so on.

Initially, the fabricator forms 610 a nano-scale mold with a negative of a liquid crystal alignment pattern. The nano-scale mold may be the mold 110. As noted above, the fabricator may form the mold using various processes, such as with photolithography.

The fabricator imprints 620 a resist material on the mold. This may be accomplished by applying force to join the resist material with the mold such that the resist material fills the voids within the mold and forms a negative or inverse image of the mold pattern. The resist material may be the resist material 116.

The fabricator performs 630 a set operation on the resist material to cause the resist material to set. For example, this may be achieved by the fabricator using a UV light to cure the resist material, or by applying heat to the resist material such that a curing temperature is reached. This resist material forms the liquid crystal alignment layer. This may be the alignment layer 124. The fabricator also separates 640 the nano-scale mold from the newly formed liquid crystal alignment layer.

The fabricator performs 650 an infiltration operation to cause the liquid crystals to be deposited on the alignment layer. The alignment layer causes the liquid crystals to form the liquid crystal alignment pattern. As noted, the liquid crystals assume the orientation indicated in the liquid crystal alignment pattern.

Additional Configuration Information

The foregoing description of the embodiments of the disclosure have been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A device comprising:
   a layer of liquid crystals, the layer of liquid crystals aligned according to a liquid crystal alignment pattern;
   wherein the liquid crystal alignment pattern is formed by infiltrating liquid crystals into a liquid crystal alignment layer formed via an imprint from a nano-scale mold, and wherein the nano-scale mold is formed using a double-pattern method to create, in at least one portion of the layer of liquid crystals, a pattern that is under a lithography limit of 10 nm, the double-pattern method comprising:
forming one or more mandrels on a substrate;
depositing a uniform coating on the mandrels and the substrate;
anisotropically etching the uniform coating; and
removing the mandrels from the substrate, the anisotropically etched uniform coating forming the nano-scale mold.

2. The device of claim 1, further comprising:
a second layer of liquid crystals adhered to the layer of liquid crystals, the second layer of liquid crystals aligned according to a second liquid crystal alignment pattern, the second liquid crystal alignment pattern formed by a second liquid crystal alignment layer.

3. The device of claim 1, further comprising:
a substrate layer, wherein the layer of liquid crystals is formed on the substrate layer, and
wherein the substrate layer receives input radiation in a direction parallel to the plane of the layer of liquid crystals, the input radiation reflected internally within the substrate layer to exit the substrate layer in a direction orthogonal to the plane of the layer of liquid crystals.

4. The device of claim 1, further comprising:
a layer of transparent electrodes formed on the layer of liquid crystals, the layer of transparent electrodes, when activated, configured to modify an alignment of the layer of liquid crystals.

5. The device of claim 1, wherein the formation of the layer of liquid crystals comprises:
forming the nano-scale mold with a negative of the liquid crystal alignment pattern;
imprinting a resist material on the nano-scale mold;
performing a set operation on the resist material to cause the resist material to set, the resist material forming the liquid crystal alignment layer;
separating the nano-scale mold from the liquid crystal alignment layer; and
performing an infiltration operation to cause liquid crystals to be deposited on the liquid crystal alignment layer to form the layer of liquid crystals, the liquid crystal alignment layer causing the liquid crystals to form the liquid crystal alignment pattern.

6. The device of claim 1, wherein the nano-scale mold comprises a poly-methyl methacrylate material, wherein the nano-scale mold is formed on a silicon substrate, and wherein the nano-scale mold is formed according to an electron beam pattern.

7. The device of claim 1, wherein the nano-scale mold is non-planar in shape.

8. The device of claim 1, wherein the formation of the layer of liquid crystals further comprises:
applying anti-adhesion material on the nano-scale mold.

9. The device of claim 1, wherein the nano-scale mold is a daughter mold formed from a master mold.

10. The device of claim 5, wherein the resist material is formed on a substrate, the substrate comprising one or more alignment features matching alignment features on the nano-scale mold.

11. The device of claim 5, wherein the imprinting the resist material causes the nano-scale mold to be applied to the resist material at a certain pressure, temperature, and duration to cause the resist material to fill all voids in the nano-scale mold.

12. The device of claim 5, wherein the set operation causes the resist material to be exposed to ultraviolet radiation.

13. The device of claim 5, wherein the resist material is transparent to a range of frequencies of electromagnetic radiation.

14. The device of claim 1, wherein the liquid crystal alignment pattern includes features under 10 nanometers in length.

15. The device of claim 1, wherein the liquid crystal alignment pattern causes individual adjacent pixels of a display to be polarized in an alternating pattern.

16. The device of claim 1, wherein the liquid crystal alignment pattern causes the liquid crystal layer to form a diffraction grating.

17. The device of claim 5, wherein the formation of the layer of liquid crystals further comprises:
imprinting an additional resist material on the nano-scale mold;
performing the set operation on the additional resist material, the additional resist material forming an additional liquid crystal alignment layer;
separating the nano-scale mold from the additional liquid crystal alignment layer; and
performing the infiltration operation to cause liquid crystals to be deposited on the additional liquid crystal alignment layer.

18. The device of claim 17, wherein the liquid crystal alignment layer is adhered to the additional liquid crystal alignment layer to form a double alignment layer.

19. The device of claim 18, wherein the infiltration operation causes the liquid crystals to be deposited via capillary action within the double alignment layer.

* * * * *